(12) United States Patent
Feng et al.

(10) Patent No.: US 12,550,596 B2
(45) Date of Patent: Feb. 10, 2026

(54) DISPLAY PANEL AND DISPLAY APPARATUS FOR IMPROVING COLOR DEVIATION

(71) Applicants: Chengdu BOE Optoelectronics Technology Co., Ltd., Sichuan (CN); BOE Technology Group Co., Ltd., Beijing (CN)

(72) Inventors: Jingyi Feng, Beijing (CN); Xiaoxin Li, Beijing (CN); Jianmin Ye, Beijing (CN); Mingchao Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 343 days.

(21) Appl. No.: 18/021,610

(22) PCT Filed: Apr. 29, 2022

(86) PCT No.: PCT/CN2022/090586
§ 371 (c)(1),
(2) Date: Feb. 16, 2023

(87) PCT Pub. No.: WO2023/206487
PCT Pub. Date: Nov. 2, 2023

(65) Prior Publication Data
US 2024/0268197 A1    Aug. 8, 2024

(51) Int. Cl.
*H10K 59/80*    (2023.01)
*H10K 59/35*    (2023.01)
*H10K 59/38*    (2023.01)

(52) U.S. Cl.
CPC ......... *H10K 59/879* (2023.02); *H10K 59/353* (2023.02); *H10K 59/38* (2023.02); *H10K 59/8792* (2023.02)

(58) Field of Classification Search
CPC .... H10K 59/879; H10K 59/353; H10K 59/38; H10K 59/8792
See application file for complete search history.

(56) References Cited

U.S. PATENT DOCUMENTS

| 2020/0365666 A1 | 11/2020 | Kim et al. |
| 2021/0184179 A1 | 6/2021 | Kim et al. |

(Continued)

FOREIGN PATENT DOCUMENTS

| CN | 109216581 A | 1/2019 |
| CN | 111446379 A | 7/2020 |

(Continued)

OTHER PUBLICATIONS

Office Action dated Nov. 27, 2025, issued in counterpart CN Application No. 202280001085.8, with English traslation. (19 pages).

*Primary Examiner* — Nduka E Ojeh
(74) *Attorney, Agent, or Firm* — WHDA, LLP

(57) ABSTRACT

The display panel includes a substrate and a plurality of light-emitting units disposed on the substrate, wherein the light-emitting units includes a plurality of light-emitting devices arranged in an array, and a barrier is disposed between neighboring light-emitting devices, a dimming layer disposed on the light-exiting side of light-emitting unit, wherein the dimming layer includes a plurality of first refracting portions arranged in an array, and a second refracting portion is disposed between neighboring first refracting portions and contacted with the first refracting portions; and orthographic projections of the first refracting portions on the substrate overlap with an orthographic projection of the barrier on the substrate, and an orthographic projection of the second refracting portions on the substrate overlaps with orthographic projections of the light-emitting devices on the substrate.

18 Claims, 5 Drawing Sheets

(56) References Cited

U.S. PATENT DOCUMENTS

| | | | |
|---|---|---|---|
| 2022/0045304 A1* | 2/2022 | Cai | H10K 59/353 |
| 2022/0173362 A1* | 6/2022 | Kim | H10K 50/86 |
| 2023/0122736 A1* | 4/2023 | Kim | H10K 59/38 |
| | | | 257/40 |
| 2023/0157062 A1 | 5/2023 | Cai et al. | |

FOREIGN PATENT DOCUMENTS

| | | |
|---|---|---|
| CN | 112186007 A | 1/2021 |
| CN | 113054136 A | 6/2021 |
| CN | 113130608 A | 7/2021 |
| CN | 113690389 A | 11/2021 |
| CN | 113964280 A | 1/2022 |
| CN | 215578616 U | 1/2022 |
| CN | 114005861 A | 2/2022 |
| CN | 114023908 A | 2/2022 |
| CN | 114068843 A | 2/2022 |

* cited by examiner

DISPLAY PANEL AND DISPLAY APPARATUS FOR IMPROVING COLOR DEVIATION

TECHNICAL FIELD

The present application relates to the technical field of displaying and, more particularly, to a display panel and display apparatus.

BACKGROUND

With the development of science and technology, organic light-emitting diode (OLED) display apparatus has been more and more widely used. However, the current OLED display apparatus has low light extraction efficiency, and is easy to have color deviation problems such as drifting towards red and towards blue under large viewing angles, which seriously affects the effect of display apparatus and leads to a poor user experience.

SUMMARY

The embodiments of the present application employ the following technical solutions:

In the first aspect, the embodiments of the present disclosure provide a display panel, including:

a substrate and a plurality of light-emitting units disposed on the substrate, wherein the light-emitting units includes a plurality of light-emitting devices arranged in an array, and a barrier is disposed between neighboring light-emitting devices;

a dimming layer disposed on a light-exiting side of the light-emitting unit; wherein the dimming layer includes a plurality of first refracting portions arranged in an array, and a second refracting portion is disposed between neighboring first refracting portions and contacted with the first refracting portions; and orthographic projections of the first refracting portions on the substrate overlap with an orthographic projection of the barrier on the substrate, and an orthographic projection of the second refracting portion on the substrate overlaps with orthographic projections of the light-emitting devices on the substrate;

wherein a refractive index of a material of the first refracting portion is less than a refractive index of a material of the second refracting portion.

Optionally, for a contacting surface of the first refracting portion and the second refracting portion, and for a displaying surface of the display panel, an angle between the contacting surface and the displaying surface is an acute angle or an obtuse angle.

Optionally, for the light-emitting devices in one light-emitting unit, a diffusion distance of at least one light-emitting device is less than diffusion distances of the other light-emitting devices; wherein the diffusion distance refers to a distance between a boundary of the orthographic projection of the light-emitting device on the substrate and a boundary of the orthographic projection of the first refracting portion on the substrate.

Optionally, the light-emitting unit comprises a red light-emitting device, a green light-emitting device and a blue light-emitting device; and a diffusion distance of the red light-emitting device is less than a diffusion distance of the green light-emitting device, and a diffusion distance of the red light-emitting device is less than the diffusion distance of the blue light-emitting device.

Optionally, the light-emitting unit comprises a red light-emitting device, a green light-emitting device and a blue light-emitting device and a diffusion distance of the blue light-emitting device is less than a diffusion distance of the green light-emitting device, and a diffusion distance of the blue light-emitting device is less than a diffusion distance of the red light-emitting device.

Optionally, for contacting surfaces of the first refracting portions and the second refracting portions corresponding to one light-emitting unit, and for the displaying surface of the display panel, a plurality of first inclining angles are formed by the contacting surfaces and the displaying surface, wherein at least one of the first inclining angles is larger than the other first inclining angles.

Optionally, the light-emitting unit comprises a red light-emitting device, a green light-emitting device and a blue light-emitting device, for a contacting surface of the first refracting portion and the second refracting portion corresponding to the red light-emitting device, and for a displaying surface of the display panel, the first inclining angle between the contacting surface and the displaying surface is the largest.

Optionally, the light-emitting unit comprises a red light-emitting device, a green light-emitting device and a blue light-emitting device, for a contacting surface of the first refracting portion and the second refracting portion corresponding to the blue light-emitting device, and for a displaying surface of the display panel, the first inclining angle between the contacting surface and the displaying surface is the largest.

Optionally, in the first refracting portions corresponding to one light-emitting unit, a height of at least one first refracting portion in a direction perpendicular to the substrate is larger than heights of the other first refracting portions in the direction perpendicular to the substrate.

Optionally, the light-emitting unit comprises a red light-emitting device, a green light-emitting device and a blue light-emitting device, and the first refracting portion which overlaps with the orthographic projection of the barrier adjacent to the red light-emitting device on the substrate has a maximum height in the direction perpendicular to the substrate.

Optionally, the light-emitting unit comprises a red light-emitting device, a green light-emitting device and a blue light-emitting device, and the first refracting portion which overlaps with the orthographic projection of the barrier adjacent to the blue light-emitting device on the substrate has a maximum height in the direction perpendicular to the substrate.

Optionally, the display panel further comprises a color converting layer, and the color converting layer is disposed between the display panel and the dimming layer, or the color converting layer is disposed on one side of the dimming layer away from the display panel.

Optionally, the color converting layer comprises a plurality of shading portions arranged in an array, and orthographic projections of the shading portions on the substrate overlap with the orthographic projection of the barrier on the substrate and the orthographic projection of the first refracting portion on the substrate; and a color film portion contacting with the shading portion is disposed between neighboring shading portions, and an orthographic projection of the color film portion on the substrate overlaps with the orthographic projection of the light-emitting device on the substrate and the orthographic projection of the second refracting portion on the substrate.

Optionally, for contacting surfaces of the shading portion and the color film portion corresponding to one light-emitting unit, and for the displaying surface of the display panel, a plurality of second inclining angles are formed by the contacting surface and the displaying surface, at least one of the second inclining angles is larger than the other second inclining angles.

Optionally, the light-emitting unit comprises a red light-emitting device, a green light-emitting device and a blue light-emitting device, for a contacting surface of the shading portion and the color firm portion corresponding to the red light-emitting unit, and for a displaying surface of the display panel, the second inclining angle between the contacting surface and the displaying surface is the largest.

Optionally, the light-emitting unit comprises a red light-emitting device, a green light-emitting device and a blue light-emitting device, for a contacting surface of the shading portion and the color firm portion corresponding to the blue light-emitting unit, and for a displaying surface of the display panel, the second inclining angle between the contacting surface and the displaying surface is the largest.

Optionally, the plurality of shading portions are disposed around one color film portion, and the second inclining angle between the contacting surface that the shading portion and the color film portion contact with each other in a first direction and the displaying surface of the display panel is larger than the second inclining angle between the contacting surface that the shading portion and the color film portion contact with each other in a second direction and the displaying surface of the display panel; and the first direction and the second direction are perpendicular.

Optionally, in one light-emitting unit, areas of all the color film portions overlapping with the orthographic projection of the light-emitting device on the substrate are the same as areas of un-overlapping parts of the shading portion overlapping with the orthographic projection of the barrier on the substrate.

Optionally, shapes of orthographic projections of the parts of the color film portions which do not overlap with the shading portion on the substrate are the same, and the shapes comprise any one of a polygon, an arc, a circle and an ellipse.

Optionally, the dimming layer further comprises a first dimming sublayer disposed on one side of the first refracting portion away from the display panel, and the first dimming sublayer covers the first refracting portion and the second refracting portion; and a refractive index of the material of the first dimming sublayer is the same as the refractive index of the material of the first refracting portion; or the refractive index of the material of the first dimming sublayer is the same as the refractive index of the material of the second refracting portion.

In the second aspect, an embodiment of the present application provides a display apparatus, including the display panel stated above.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are merely embodiments of the present application, and a person skilled in the art can obtain other figures according to these figures without paying creative work.

DETAILED DESCRIPTION

Figure 1:
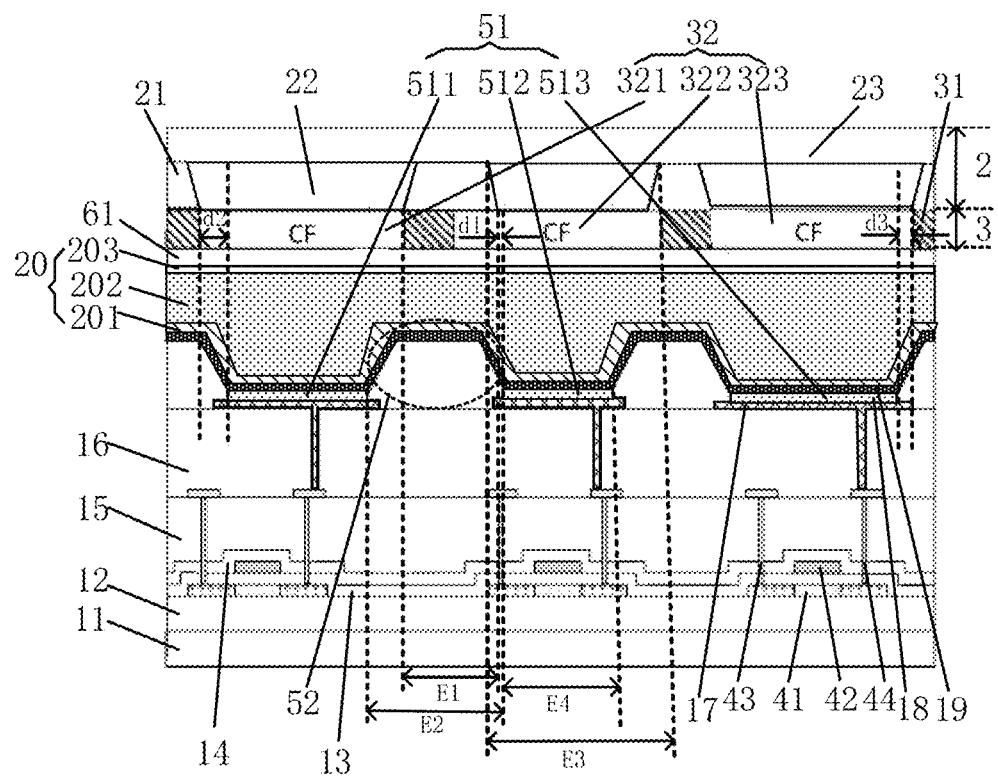
FIG. 1 is a schematic structural diagram of a display panel according to an embodiment of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the drawings, in order for clarity, the thicknesses of the areas and the layers might be exaggerated. In the drawings, the same reference numbers represent the same or similar components, and therefore the detailed description on them are omitted. Moreover, the drawings are merely schematic illustrations of the present disclosure, and are not necessarily drawn to scale.

In the embodiments of the present application, unless stated otherwise, the meaning of "at least one" is "one or more than one", unless otherwise specified. The terms that indicate orientation or position relations, such as "upper", are based on the orientation or position relations shown in the drawings, and are merely for conveniently describing the present application and simplifying the description, rather than indicating or implying that the component or element must have the specific orientation and be constructed and operated according to the specific orientation. Therefore, they should not be construed as a limitation on the present application.

Unless stated otherwise in the context, throughout the description and the claims, the term "include" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are included in at least one embodiment or example of the present application. The illustrative indication of the above terms does not necessarily refer to the same one embodiment or example. Moreover, the specific features, structures, materials or characteristics may be included in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

A display panel according to the embodiments of the present application, referring to FIG. 1, FIG. 2, FIG. 3 and FIG. 4, including: a substrate 11 and a plurality of light-emitting units disposed on the substrate 11, wherein the light-emitting units includes a plurality of light-emitting devices 51 arranged in an array, and a barrier 52 is disposed between neighboring light-emitting devices 51.

Referring to FIG. 1, FIG. 2, FIG. 3 and FIG. 4, a dimming layer 2 disposed on the light-exiting side of light-emitting unit; wherein the dimming layer 2 includes a plurality of first refracting portions 21 arranged in an array, and a second refracting portion 22 is disposed between neighboring first refracting portions 21 and contacted with the first refracting portions 21; and orthographic projections E1 of the first refracting portions 21 on the substrate 11 overlap with an orthographic projection E2 of the barrier 13 on the substrate 11, and an orthographic projection E3 of the second refracting portion 22 on the substrate 11 overlaps with orthographic projections E4 of the light-emitting devices 12 on the substrate 11.

A refractive index of a material of the first refracting portion is less than a refractive index of a material of the second refracting portion.

The display panel may be an OLED display panel; or, the display panel may also be liquid crystal display (LCD), where the specific type of the display panel is not limited.

Taking the display panel to be an OLED display panel an example, the structure of the OLED display panel is described in detail.

Referring to FIG. 1, FIG. 2, FIG. 3 and FIG. 4, the OLED display panel includes a driving back plate and a luminescent layer disposed between the driving back plate and the dimming layer. The driving back plate has a driving circuit configured for driving the luminescent layer to emit light. In some embodiments of the present application, the driving back plate may include a substrate 11 as shown in FIG. 1, FIG. 2, FIG. 3 and FIG. 4 and the driving circuit layer disposed on the substrate 11, and the driving circuit layer includes the driving circuit. The display panel may be at least divided into an active area and a non-active area except the active area. Correspondingly, the driving circuit layer may include a pixel circuit located in the active area and a peripheral circuit located in the non-active area. The pixel circuit may be pixel circuits such as 7T1C, 7T2C, 6T1C or 6T2C, as long as it can drive the light-emitting device 51 to emit light, the structure of the pixel circuit is not specifically limited here. The number of the pixel circuits is the same as the number of the light-emitting device 51, and the pixel circuits are electrically connected to the light-emitting devices 51 in a one-to-one correspondence, so as to control the light-emitting devices 51 to emit light, respectively. Wherein, nTmC refers to a pixel circuit including n transistors (denoted by the letter T) and m capacitors (denoted by the letter C).

The peripheral circuit is located in the non-active area, and the peripheral circuit is connected to the pixel circuit and configured for inputting a driving signal to the pixel circuit to control the light-emitting device 51 to emit light. The peripheral circuit may include a grid driving circuit and a light-emitting controlling circuit, of course, it may also include other circuits, and the specific structure of the peripheral circuit is not limited.

The driving circuit layer may include a plurality of thin film transistors and capacitors, wherein the thin film transistor may be a top grid thin film transistor; or, the thin film transistor may be a bottom grid thin film transistor. Each thin film transistor may include an active layer, a gird electrode, a source electrode and a drain electrode. The active layers of the thin film transistors are arranged at the same layer, the gird electrodes are arranged at the same layer, and the source electrode and the drain electrode are arranged at the same layer to simplify the process. According to the position relationship of the three electrodes, the transistors may be divided into two categories: one is that the gird electrode is located below the source electrode and the drain electrode, which is called the bottom grid transistor; the other one is that the gird electrode is located above the source electrode and the drain electrode, which is called a top grid transistor.

Referring to FIG. 1, FIG. 2, FIG. 3 and FIG. 4, the specific structure of the driving back plate is illustrated by taking the top grid thin film transistor as an example. The driving back plate includes a substrate 11, a first buffer layer 12, an active layer 41, a grid insulating layer 13, a grid electrode 42, a first flat layer 14, an interlayer dielectric layer 15, a source and drain layer (which is not marked in the figures) and a second flat layer 16. The grid insulating layer 13 covers the active layer 41 and the substrate 11; the orthographic projection of the grid electrode 42 on the substrate 11 is located within the orthographic projection of the active layer 12 on the substrate 11. The first flat layer 14 covers the grid electrode 42 and the first grid insulating layer 13; the interlayer medium layer 15 covers the first flat layer 14. The source and drain layer includes the source electrode 43 and the drain electrode 44. The source electrode 43 and the drain electrode 44 are electrically connected to two ends of the active layer 41 via a through hole (which is not shown in the figures). The second flat layer 16 covers the source and drain layer and the interlayer medium layer 15. Of course, the driving circuit layer may also include other film layers, as long as it can drive light-emitting device 51 to emit light, which is no longer detailed here.

The material of the substrate is not limited, which may include rigid materials, such as: glass; or, the material of the substrate may include flexible materials such as polyimide (PI).

In some embodiments of the present application, referring to FIG. 1, FIG. 2, FIG. 3 and FIG. 4. The light-emitting units 51 includes first electrodes 17, luminescent function layers 18 and second electrodes 19 arranged in layer configuration in a direction of the driving back plate away from the substrate 11. The first electrode 17 is electrically connected to the drain electrode 44 of a thin film transistor 44 of a pixel circuit through a through hole (which is not shown in the figures). The structure of the luminescent function layer 18 is not specifically limited. For example, the luminescent function layer may include a hole injection layer, a hole transport layer, an electron blocking layer, an organic light-emitting material layer, a hole blocking layer, an electron transport layer, and an electron injection layer arranged in layer configuration in a direction of the driving back plate away from the substrate 11. The second electrode 19 may be extended to the non-active area and electrically connected to the power signal end to receive the power signal. When displaying the image, the data signal may be applied to the first electrode through the pixel circuit, and the power signal may be applied to the second electrode through the power signal end, so that the luminescent function layer emits light. The specific principle may be obtained by referring to the related art, which is not described in detail here.

Referring to FIG. 1, FIG. 2, FIG. 3 and FIG. 4, in order to limit the range of the light-emitting devices 51, the luminescent layer may also include a plurality of barriers 52, the barrier 52 here may be a pixel define layer (PDL), and there are a plurality of openings on the PDL. The light-emitting devices 51 are located in the openings of the PDL, and the luminescent function layers 18 of the light-emitting device 51 are distributed independently. The luminescent colors of different display devices 51 may be the same or different. The second electrode 19 covers the luminescent function layer 18, so that the light-emitting device 51 may share one second electrode 19. Through the plurality of openings stated above, the light-emitting device 51 may be defined, and a boundary of any one of the light-emitting devices 51 is a boundary of the luminescent function layer 18 in the corresponding opening.

In some embodiments of the present application, the luminescent function layer 18 of each light-emitting device 51 may belong to one continuous luminescent film layer. The luminescent film layer covers one side of the first electrodes 17 and the barrier 52 away from the substrate 11 at the same time. The luminescent film layer is located in the opening and laminated on the area of the first electrode 17, which is the luminescent function layer 18 of the light-emitting device 51. The neighboring two luminescent function layers 18 are connected by other areas of the luminescent film layer. That is, the light-emitting devices 51 may share the luminescent film layer.

In some embodiments of the present application, referring to FIG. 1, FIG. 2, FIG. 3 and FIG. 4, the light-emitting units may include first light-emitting devices, second light-emitting devices and third light-emitting devices with different luminescent colors. However, the specific number of the first light-emitting devices, the second light-emitting devices and third light-emitting devices in one light-emitting unit is not limited. FIG. 1, FIG. 2, FIG. 3 and FIG. 4 are illustrated by taking that there are three light-emitting devices in each light-emitting unit as an example.

Figure 5:
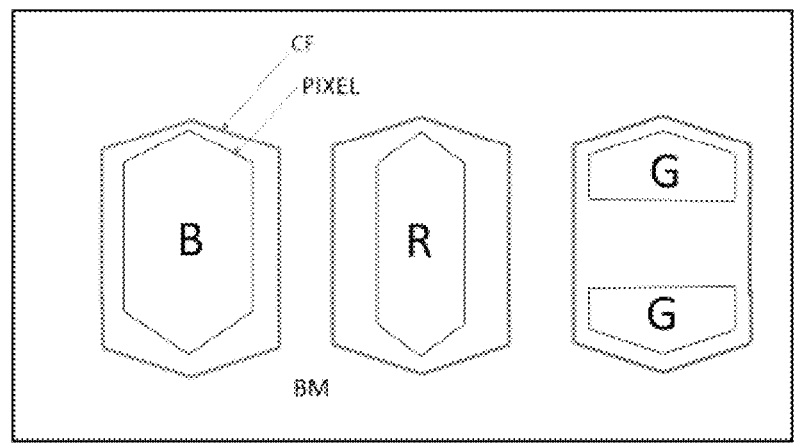
FIG. 5 is a structural top view of a first type of the light-emitting device and the color film portion in one light-emitting unit according to an embodiment of the present application.
Figure 6:
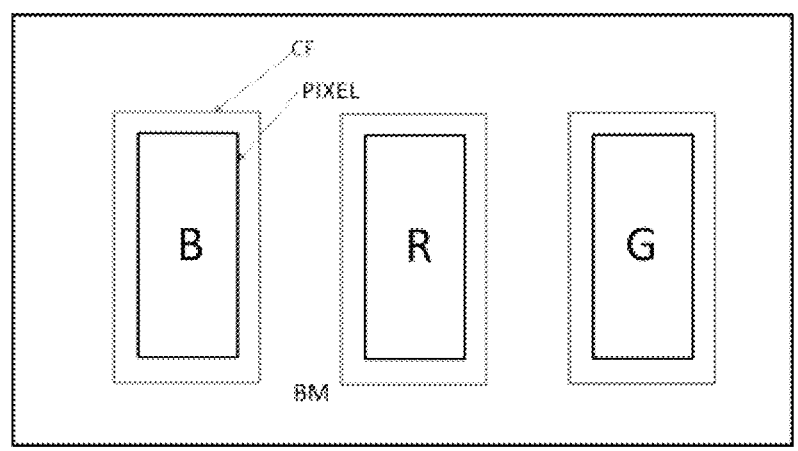
FIG. 6 is a structural top view of a second type of the light-emitting device and the color film portion in one light-emitting unit according to an embodiment of the present application.

The specific colors of the first light-emitting device, the second light-emitting device and the third light-emitting device are not limited here. Exemplarily, referring to FIG. 1, FIG. 2, FIG. 3 and FIG. 4, the first light-emitting device is a blue light-emitting device 511, the second light-emitting device is a red light-emitting device 512, and the third light-emitting device is a green light-emitting device 513. And, one light-emitting unit includes one blue light-emitting device 511, one red light-emitting device 512, and one green light-emitting device 513. There is no specific restriction on the structures of the blue light-emitting device, the red light-emitting device and the green light-emitting device. Exemplarily, as shown in FIG. 5, the blue light-emitting device (marked with B in the figures) and the red light-emitting device (marked with R in the figures) both include a layer of the luminescent function layer, and the green light-emitting device (marked with G in the figures) including two layers of luminescent function layer; or, as shown in FIG. 6, the blue light-emitting device (marked with B in the figures), the red light-emitting device (marked with R in the figures) and green light-emitting device (marked with G in the figures) all include a layer of the luminescent function layer. The PIXELs in FIG. 5 and FIG. 6 refer to the light-emitting devices.

The dimming layer is disposed on the light-exiting side of the display panel, so that the light emitted by the luminescent layer of the display panel is emitted through the dimming layer.

Here, the shape of the orthographic projection of the first refracting portion in the direction perpendicular to the substrate is not specified. Exemplarily, the shape of the orthographic projection of the first refracting portion in the direction perpendicular to the substrate may include any one of a circle, an ellipse, a positive trapezoid, and a polygon. FIG. 1, FIG. 2, FIG. 3 and FIG. 4 are illustrated with the shape of the orthographic projection of the first refracting portion 21 in the direction perpendicular to the substrate 11 as a positive trapezoid.

Here the shape of the second refracting portion is not specifically limited. Exemplarily, the shape of the orthographic projection of the second refracting portion in the direction perpendicular to the substrate may include any one of a circle, an ellipse, an inverted trapezoid, or a polygon. FIG. 1, FIG. 2, FIG. 3 and FIG. 4 are illustrated with the shape of the orthographic projection of the second refracting portion 22 in the direction perpendicular to the substrate 11 as an inverted trapezoid.

That the orthographic projection of the first refracting portion on the substrate overlaps with the orthographic projection of the barrier on the substrate refers to: the orthographic projection of the first refracting portion on the substrate overlaps with the orthographic projection of the barrier on the substrate partially; or, the orthographic projection of the first refracting portion on the substrate completely overlaps with the orthographic projection of the barrier on the substrate. FIG. 1, FIG. 2, FIG. 3 and FIG. 4 are all illustrated with the orthographic projection E1 of the first refracting portion 21 on the substrate 11 being located within the orthographic projection E2 of the barrier 13 on the substrate 11.

That the orthographic projection of the second refracting portion on the substrate overlaps with the orthographic projection of the light-emitting device on the substrate refers to: the orthographic projection of the second refracting portion on the substrate overlaps with the orthographic projection of the light-emitting device on the substrate partially; or, the orthographic projection of the second refracting portion on the substrate completely overlaps with the orthographic projection of the light-emitting device on the substrate. FIG. 1, FIG. 2, FIG. 3 and FIG. 4 are all illustrated with the orthographic projection E4 of the light-emitting device 12 on the substrate 11 being located within the orthographic projection E3 of the second refracting portion 22 on the substrate 11.

Figure 7:
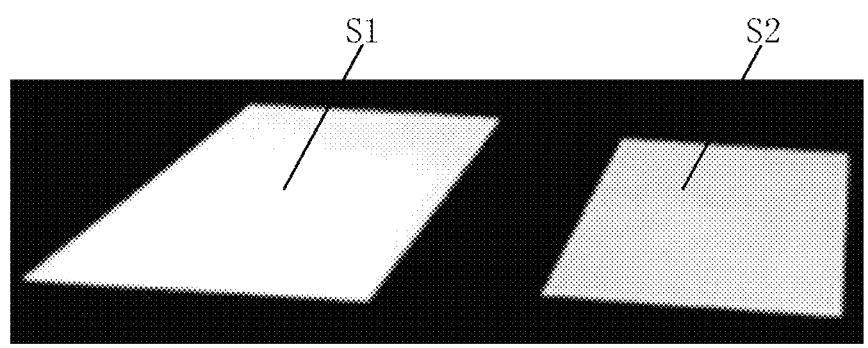
FIG. 7 is a large viewing angle color deviation comparison diagram of two display products according to an embodiment of the present application.

The existing screens, because of the characteristics of the organic material (EL material) that constitutes the luminescent function layer, have the problem of color deviation under large viewing angles, such as towards red, towards green or towards blue. Here, the color deviation towards red under large viewing angles is that when the user observes the display panel under a large side viewing angle, two red sides of the display panel emit more lights. Referring to FIG. 7, the same user sees the colors displayed by two different display products (that is, a product S1 and a product S2) under the same large viewing angle. The color displayed by the product S1 is normal, and comparing with the color displayed by the product S1, there is a problem of color deviation under large viewing angles of the color displayed by the product S2.

The display panel according to the embodiments of the present disclosure includes: a substrate and a plurality of light-emitting units disposed on the substrate, wherein the light-emitting units includes a plurality of light-emitting devices arranged in an array, and a barrier is disposed between neighboring light-emitting devices; a dimming layer disposed on the light-exiting side of light-emitting unit; wherein the dimming layer includes a plurality of first refracting portions arranged in an array, and a second refracting portion is disposed between neighboring first refracting portions and contacted with the first refracting portions; and orthographic projections of the first refracting portions on the substrate overlap with an orthographic projection of the barrier on the substrate, and an orthographic projection of the second refracting portion on the substrate overlaps with orthographic projections of the light-emitting devices on the substrate; wherein a refractive index of a material of the first refracting portion is less than a refractive index of a material of the second refracting portion. Thus, when the light is emitted from the light-emitting device of the display panel to the dimming layer, since the refractive index of the first refracting portion is less than the refractive index of the second refracting portion. The large angle light emitted by the light-emitting device may enter the first refracting portion again after emitting to the second refracting portion, which effectively increases the front light-exiting of the display panel and effectively reduces the side light-exiting of the large angle light, thus effectively improving the extraction efficiency of the internal light of the display panel, and effectively improving the color deviation problem under large angles, thereby improving the performance of the display panel and leading to a good user experience.

Optionally, referring to FIG. 1, FIG. 2, FIG. 3 and FIG. 4, for a contacting surface of the first refracting portion 21 and the second refracting portion 22, and for a displaying surface of the display panel, an angle between the contacting surface and the displaying surface is an acute angle or an obtuse angle.

The displaying surface of the display panel refers to a side of the display panel used for displaying images.

Here, there is no specific limit on the size of the acute angle mentioned above. Exemplarily, the acute angle may include 30°, 45°, 60° and so on.

Here, there is no specific limit on the size of the obtuse angle mentioned above. Exemplarily, the obtuse angle can include 120°, 145°, 160° and so on.

Because for contacting surface of the first refracting portion and the second refracting portion, and for the displaying surface of the display panel, when the angle between the contacting surface and the displaying surface is a right angle, the light will directly emit through the contacting surface of the first refracting portion and the second refracting portion. In order to avoid the direct emission of light through the contacting surface of the first refracting portion and the second refracting portion, it is set that in the embodiments of the present application, for contacting surface of the first refracting portion and the second refracting portion, and for the displaying surface of the display panel, the angle between the contacting surface and the displaying surface is the acute angle or the obtuse angle, so that the light coming from the second refracting portion may be emitted after passing through the first refracting portion, so as to improve the efficiency of light extraction and the color deviation problem under large angles.

Optionally, in order to further reduce the color deviation problem of the display panel with respect to a certain color or some colors, referring to FIG. 1, for the light-emitting devices 51 in one light-emitting unit, a diffusion distance of at least one light-emitting device 51 is less than diffusion distances of the other light-emitting devices 51; wherein the diffusion distance refers to a distance between a boundary of the orthographic projection of the light-emitting device 51 on the substrate 11 and a boundary of the orthographic projection of the first refracting portion 21 on the substrate 11. Therefore, by increasing the first refracting portion that emits light of a certain color or some colors, more lights of that color may be occluded/absorbed, thereby reducing the proportion of light of that color. For example, if the picture is color deviation towards red at a large viewing angle, the first refracting portion 21 on both sides of the red light-emitting device in a direction perpendicular to the substrate shown in FIG. 1 may be increased. Specifically, the first refracting portion 21 is widened in the direction parallel to the displaying surface, thereby reducing red light and improving the color deviation towards red phenomenon at a large viewing angle.

The number of light-emitting devices in one light-emitting unit above is not specifically limited. Here, the number of light-emitting devices in one light-emitting unit may be two, three, four and so on.

The diffusion distance of at least one display device is less than the diffusion distances of other display devices, and the number of the light-emitting devices with low diffusion distance is not specifically limited here. Exemplarily, when the number of the light-emitting devices of one light-emitting unit is three, including, for example, the blue light-emitting device, the red light-emitting device, and the green light-emitting device shown in FIG. 1, it may be that the diffusion distance of the blue light-emitting device is less than the diffusion distance of the red light-emitting device, and the diffusion distance of the blue light-emitting device is less than the diffusion distance of the green light-emitting device. Alternatively, it may also be that the diffusion distance of the blue light-emitting device is less than the diffusion distance of the green light-emitting device, and the diffusion distance of the green light-emitting device is less than the diffusion distance of the red light-emitting device. Alternatively, it may also be that the diffusion distance of the blue light-emitting device and the diffusion distance of the red light-emitting device are both less than the diffusion distance of the green light-emitting device, which is determined according to actual applications.

It should be noted that the diffusion distance may be set not less than 0, so as to avoid the first refracting portion causing excessive occlusion to the light-emitting device and affecting the brightness of the picture.

Optionally, in order to further reduce the redness and cyan of the display panel under a large viewing angle, referring to FIG. 1, the light-emitting unit includes a red light-emitting device 512, a green light-emitting device 513 and a blue light-emitting device 511; and a diffusion distance of the red light-emitting device 512 is less than a diffusion distance of the green light-emitting device 513, and a diffusion distance of the red light-emitting device 512 is less than the diffusion distance of the blue light-emitting device 511. By configuring that the opening of the first refracting portion is close to the red (R) light-emitting device, the color deviation towards red under a large viewing angle may be further controlled, so that the display panel presents a better display effect.

The area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may be not completely the same. At current, in view of the characteristics of the red luminescent materials, the green luminescent materials and the blue luminescent materials, referring to FIG. 1, it is often set as that the area of the blue light-emitting device is larger than the area of the green light-emitting device, and the area of the green light-emitting device is larger than the area of the red light-emitting device.

Here, the relative relationship between the diffusion distance of the green light-emitting device and the diffusion distance of the blue light-emitting device is not limited. Exemplarily, it may be that the diffusion distance of the green light-emitting device is the same as the diffusion distance of the blue light-emitting device. Alternatively, it may also be that the diffusion distance of the green light-emitting device is less than the diffusion distance of the blue light-emitting device. Alternatively, the diffusion distance of the blue light-emitting device is less than the diffusion distance of the green light-emitting device.

Optionally, in order to further reduce the problem that the display panel appear color deviation towards blue under a large viewing angle, the light-emitting unit includes a red light-emitting device, a green light-emitting device and a blue light-emitting device. The diffusion distance of the blue light-emitting device is less than the diffusion distance of the green light-emitting device, and the diffusion distance of the blue light-emitting device is less than the diffusion distance of the red light-emitting device. By configuring that the opening of the first refracting portion is close to the blue light-emitting device, the color deviation towards blue under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may be not completely the same. At current, in view of the characteristics of the red luminescent materials, the green luminescent materials and the blue luminescent materials, referring to FIG. 1, it is often set as that the area of the blue light-emitting device is larger than the area of the green light-emitting device, and the area of the green light-emitting device is larger than the area of the red light-emitting device.

Here, the relative relationship between the diffusion distance of the green light-emitting device and the diffusion distance of the red light-emitting device is not limited. Exemplarily, it may be that the diffusion distance of the green light-emitting device is the same as the diffusion distance of the red light-emitting device. Alternatively, it may also be that the diffusion distance of the green light-emitting device is less than the diffusion distance of the red light-emitting device. Alternatively, the diffusion distance of the red light-emitting device is less than the diffusion distance of the green light-emitting device.

Figure 2:
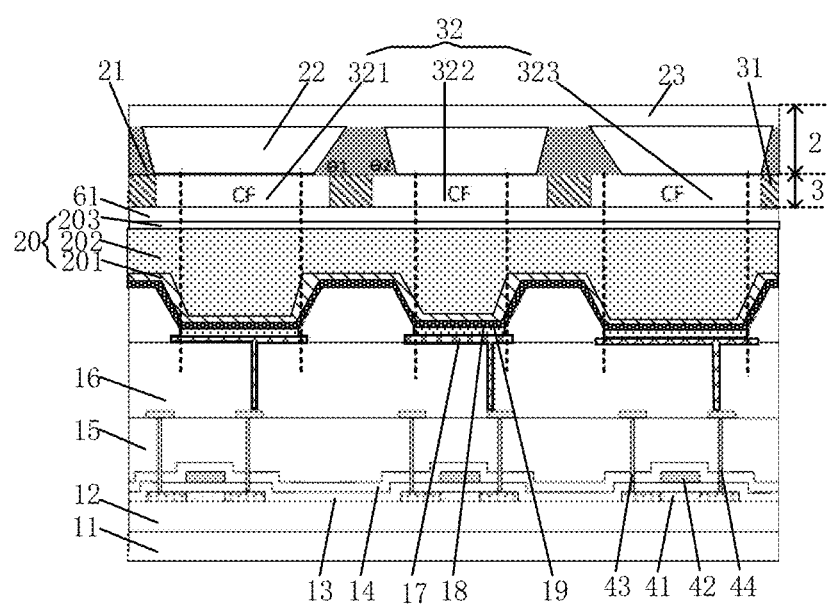
FIG. 2 is a schematic structural diagram of a display panel according to another embodiment of the present application.

Optionally, in order to further reduce the color deviation of the display panel with respect to a certain color and some colors, referring to FIG. 2, for the contacting surface of the first refracting portion 21 and the second refracting portion 22 corresponding to one light-emitting unit and for the displaying surface of the display panel, a plurality of first inclining angles are formed by the contacting surface and the displaying surface, at least one of the first inclining angles is larger than the other first inclining angles. By controlling the first inclining angles between the contacting surface and the displaying surface, wherein the contacting surface refers to the contacting surface of the first refracting portion and the second refracting portion, the displaying surface refers to the displaying surface of the display panel, that is, the smaller the inclination of the contacting surface of the first refracting portion and the second refracting portion, the faster the L-decay decreases under the large viewing angle of the corresponding color. For example, if the picture appears color deviation towards red under a large viewing angle, as shown in FIG. 2, the angle θ2 corresponding to the red (R) light-emitting device of the contacting surface of the first refracting portion 21 and the second refracting portion 22 is larger, which may effectively improve the condition of color deviation towards red.

Here, the relationship between the other first inclining angles stated above is not specifically limited. Exemplarily, the above other first inclining angles may be the same. Or, the other first inclining angles stated above may be different; alternatively, the other first inclining angles may be partially the same.

It should be noted that as shown in FIG. 2, the first refracting portion 21 is a positive trapezoid, and the second refracting portion 22 is an inverted trapezoid. There are two first inclining angles between the contacting surface of the first refracting portion 21 and the second refracting portion 22 corresponding to the red (R) light-emitting device and the displaying surface of the display panel. The first inclining angles may be the inner angle or outer angle of the first refracting portion 21, here, the first inclining angle refers to the inner angle of the first refracting portion 21.

Optionally, in order to further reduce the redness and cyan of the display panel under a large viewing angle, referring to FIG. 2, the light-emitting unit includes a red light-emitting device 512, a green light-emitting device 513 and a blue light-emitting device 511, for a contacting surface of the first refracting portion 21 and the second refracting portion 22 corresponding to the red light-emitting device 512, and for the displaying surface of the display panel, the first inclining angle between the contacting surface and the displaying surface is the largest. By controlling the first inclining angle, that is, setting θ2>θ1 as shown in FIG. 2, the color deviation towards red phenomenon under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may not completely the same. At current, in view of the characteristics of the red luminescent materials, the green luminescent materials and the blue luminescent materials, referring to FIG. 2, it is often set as that the area of the blue light-emitting device is larger than the area of the green light-emitting device, and the area of the green light-emitting device is larger than the area of the red light-emitting device.

Here, the relative relationship between the first inclining angle between the contacting surface of the first refracting portion and the second refracting portion corresponding to the green light-emitting device and the displaying surface of the display panel and the first inclining angle between the contacting surface of the first refracting portion and the second refracting portion corresponding to the blue light-emitting device and the displaying surface of the display panel is not limited. Exemplarily, it may be that the first inclining angle between the contacting surface of the first refracting portion and the second refracting portion corresponding to the green light-emitting device and the displaying surface of the display panel is larger than the first inclining angle between the contacting surface of the first refracting portion and the second refracting portion corresponding to the blue light-emitting device and the displaying surface of the display panel. Or, it may also be that the first inclining angle between the contacting surface of the first refracting portion and the second refracting portion corresponding to the green light-emitting device and the displaying surface of the display panel is the same to the first inclining angle between the contacting surface of the first refracting portion and the second refracting portion corresponding to the blue light-emitting device and the displaying surface of the display panel. Or, it may also be that the first inclining angle between the contacting surface of the first refracting portion and the second refracting portion corresponding to the blue light-emitting device and the displaying surface of the display panel is larger than the first inclining angle between the contacting surface of the first refracting portion and the second refracting portion corresponding to the green light-emitting device and the displaying surface of the display panel.

Optionally, in order to further reduce the problem that the display panel appear color deviation towards blue under a large viewing angle, the light-emitting unit includes a red light-emitting device, a green light-emitting device and a blue light-emitting device, for a contacting surface of the first refracting portion and the second refracting portion corresponding to the blue light-emitting device, and for a displaying surface of the display panel, and the first inclining angle between the contacting surface and the displaying surface is the largest. By controlling the first inclining angle, the color deviation towards blue under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may not completely the same. At current, in view of the characteristics of the red luminescent materials, the green luminescent materials and the blue luminescent materials, referring to FIG. 2, it is often set as that the area of the blue light-emitting device is larger than the area of the green light-emitting device, and the area of the green light-emitting device is larger than the area of the red light-emitting device.

Here, the relative relationship between the first inclining angle between the contacting surface of the first refracting portion and the second refracting portion corresponding to the green light-emitting device and the displaying surface of the display panel and the first inclining angle between the contacting surface of the first refracting portion and the second refracting portion corresponding to the red light-emitting device and the displaying surface of the display panel is not limited. Exemplarily, it may be that the first inclining angle between the contacting surface of the first refracting portion and the second refracting portion corresponding to the green light-emitting device and the displaying surface of the display panel is larger than the first inclining angle between the contacting surface of the first refracting portion and the second refracting portion corresponding to the red light-emitting device and the displaying surface of the display panel. Or, it may also be that the first inclining angle between the contacting surface of the first refracting portion and the second refracting portion corresponding to the green light-emitting device and the displaying surface of the display panel is the same to the first inclining angle between the contacting surface of the first refracting portion and the second refracting portion corresponding to the red light-emitting device and the displaying surface of the display panel. Or, it may also be that the first inclining angle between the contacting surface of the first refracting portion and the second refracting portion corresponding to the red light-emitting device and the displaying surface of the display panel is larger than the first inclining angle between the contacting surface of the first refracting portion and the second refracting portion corresponding to the green light-emitting device and the displaying surface of the display panel.

Figure 3:
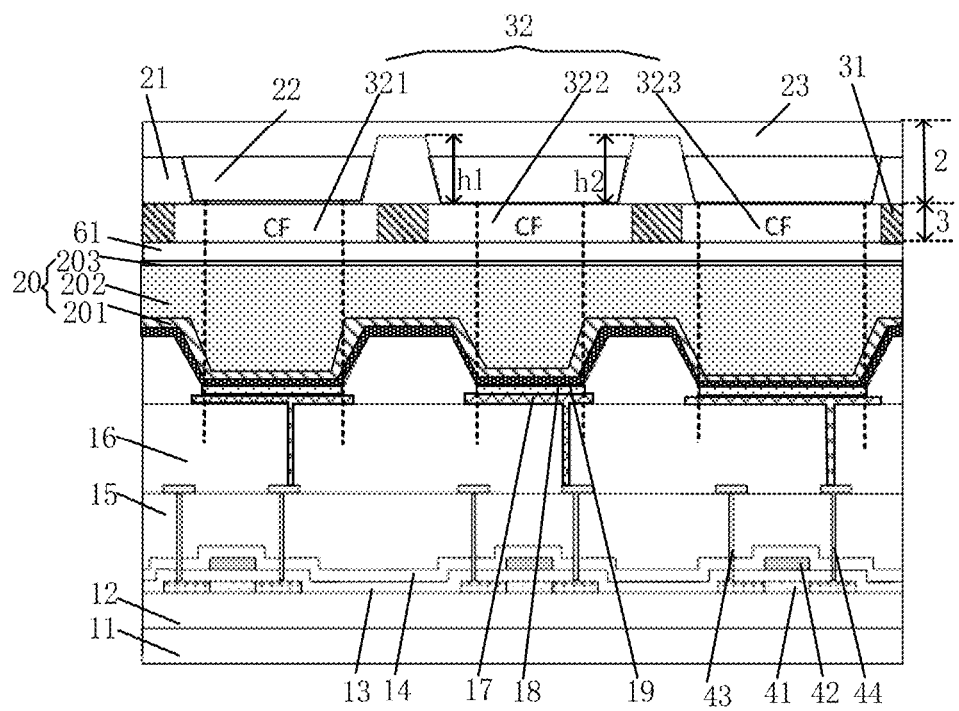
FIG. 3 is a schematic structural diagram of a display panel according to yet another embodiment of the present application.

Optionally, in order to further reduce the color deviation problem of the display panel with respect to a certain color or some colors, referring to FIG. 3, in the first refracting portions 21 corresponding to one light-emitting unit, a height of at least one first refracting portion 21 in a direction perpendicular to the substrate 11 is larger than heights of the other first refracting portions 21 in the direction perpendicular to the substrate 11. By changing the height of the first refracting portion, that is, the higher the height of the first refracting portion, the faster the corresponding large viewing angle L-decay decreases. For example, if the picture appears color deviation towards red under a large viewing angle, as shown in FIG. 3, the first refracting portion 21 disposed on both sides of the red (R) display device in the direction perpendicular to the substrate may have the highest height in the direction perpendicular to substrate 11, which may effectively improve the condition of color deviation towards red.

The height of at least one first refracting portion in the direction perpendicular to the substrate is larger than the heights of other first refracting portions in the direction perpendicular to the substrate. Here, the height of the first refracting portion with large heights in the direction perpendicular to the substrate is not specifically limited. Exemplarily, it may be that all heights of the first refracting portions with large heights corresponding to one light-emitting unit are the same; or, it can be that all heights of the first refracting portions with large heights corresponding to one light-emitting unit are partially same.

Optionally, in order to further reduce the redness and cyan of the display panel under a large viewing angle, referring to FIG. 3, the light-emitting unit includes a red light-emitting device 512, a green light-emitting device 513 and a blue light-emitting device 511 and the first refracting portion 21 which overlaps with the orthographic projection of the barrier 52 adjacent to the red light-emitting device 512 on the substrate 11 has a maximum height in the direction perpendicular to the substrate 11. By increasing the height of at least one first refracting portion corresponding to the red (R) light-emitting device in the direction perpendicular to the substrate, the color deviation towards red under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may be not completely the same. At current, in view of the characteristics of the red luminescent materials, the green luminescent materials and the blue luminescent materials, referring to FIG. 3, it is often set as that the area of the blue light-emitting device is larger than the area of the green light-emitting device, and the area of the green light-emitting device is larger than the area of the red light-emitting device.

Here, the number of the first refracting portions that overlap with the orthographic projection of the barrier adjacent to the red light-emitting device on the substrate is not specifically limited. Exemplarily, as shown in FIG. 3, the height h1 and the height h2 of the two first refracting portions 21 corresponding to the red light-emitting device 512 are the same and the highest. Or, it may also be that a height of the first refracting portion corresponding to a red light-emitting device has the highest height. Or, it may also be that the heights of the two first refracting portions corresponding to the red light-emitting device are different, but the heights are higher than other first refracting portions.

Here, the relative relationship between the height of the first refracting portion in the direction perpendicular to the substrate that overlap with the orthographic projection of the barrier adjacent to the green light-emitting device on the substrate and the height of the first refracting portion in the direction perpendicular to the substrate that overlap with the orthographic projection of the barrier adjacent to the blue light-emitting device on the substrate is not specifically limited. Exemplarily, it may be that the height of the first refracting portion in the direction perpendicular to the substrate that overlap with the orthographic projection of the barrier adjacent to the green light-emitting device on the substrate is the same as the height of the first refracting portion in the direction perpendicular to the substrate that overlap with the orthographic projection of the barrier adjacent to the blue light-emitting device on the substrate. Or, it may also be that the height of the first refracting portion in the direction perpendicular to the substrate that overlap with the orthographic projection of the barrier adjacent to the green light-emitting device on the substrate is larger than the height of the first refracting portion in the direction perpendicular to the substrate that overlap with the orthographic projection of the barrier adjacent to the blue light-emitting device on the substrate. Or, it may also be that the height of the first refracting portion in the direction perpendicular to the substrate that overlap with the orthographic projection of the barrier adjacent to the blue light-emitting device on the substrate is larger than the height of the first refracting portion in the direction perpendicular to the substrate that overlap with the orthographic projection of the barrier adjacent to the green light-emitting device on the substrate.

Optionally, in order to further reduce the problem that the display panel appear color deviation towards blue under a large viewing angle, the light-emitting unit includes a red light-emitting device, a green light-emitting device and a blue light-emitting device and the first refracting portion which overlaps with the orthographic projection of the barrier adjacent to the blue light-emitting device on the substrate has a maximum height in the direction perpendicular to the substrate. By increasing the height of at least one first refractive part corresponding to the blue light emitting device in the direction perpendicular to the substrate, the color deviation towards blue under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may be not completely the same. At current, in view of the characteristics of the red luminescent materials, the green luminescent materials and the blue luminescent materials, referring to FIG. 3, it is often set as that the area of the blue light-emitting device is larger than the area of the green light-emitting device, and the area of the green light-emitting device is larger than the area of the red light-emitting device.

Here, the number of the first refracting portions that overlap with the orthographic projection of the barrier adjacent to the blue light-emitting device on the substrate is not specifically limited. Exemplarily, as shown in FIG. 3, the heights of the two first refracting portions 21 corresponding to the blue light-emitting device 511 are the same and the highest. Or, it may also be that a height of the first refracting portion corresponding to a blue light-emitting device has the highest height. Or, it may also be that the heights of the two first refracting portions corresponding to the blue light-emitting device are different, but the heights are higher than other first refracting portions.

Here, the relative relationship between the height of the first refracting portion in the direction perpendicular to the substrate that overlap with the orthographic projection of the barrier adjacent to the green light-emitting device on the substrate and the height of the first refracting portion in the direction perpendicular to the substrate that overlap with the orthographic projection of the barrier adjacent to the red light-emitting device on the substrate is not specifically limited. Exemplarily, it may be that the height of the first refracting portion in the direction perpendicular to the substrate that overlap with the orthographic projection of the barrier adjacent to the green light-emitting device on the substrate is the same as the height of the first refracting portion in the direction perpendicular to the substrate that overlap with the orthographic projection of the barrier adjacent to the red light-emitting device on the substrate. Or, it may also be that the height of the first refracting portion in the direction perpendicular to the substrate that overlap with the orthographic projection of the barrier adjacent to the green light-emitting device on the substrate is larger than the height of the first refracting portion in the direction perpendicular to the substrate that overlap with the orthographic projection of the barrier adjacent to the red light-emitting device on the substrate. Or, it may also be that the height of the first refracting portion in the direction perpendicular to the substrate that overlap with the orthographic projection of the barrier adjacent to the red light-emitting device on the substrate is larger than the height of the first refracting portion in the direction perpendicular to the substrate that overlap with the orthographic projection of the barrier adjacent to the green light-emitting device on the substrate.

Optionally, as shown in FIG. 1, FIG. 2, FIG. 3 and FIG. 4, the display panel further includes a color converting layer 3, and the color converting layer 3 is disposed between the display panel and the dimming layer 2.

Or, the color converting layer is disposed on one side of the dimming layer away from the display panel.

The structure of the color converting layer stated above is not specifically limited here. Exemplarily, the color converting layer stated above may include a color film portion 32 and a shading portion 31 as shown in FIG. 1, FIG. 2, FIG. 3 and FIG. 4.

In the display panel according to the embodiments of the present application, the color converting layer can effectively improve the light extraction effect and save the cost while avoiding the use of polarizers.

Optionally, as shown in FIG. 1, FIG. 2, FIG. 3 and FIG. 4, the color converting layer 3 includes a plurality of shading portions 31 arranged in an array, and orthographic projections of the shading portions 31 on the substrate 11 overlap with the orthographic projection of the barrier 52 on the substrate 11 and an orthographic projection of the first refracting portion 21 on the substrate 11.

A color film portion 32 contacting with the shading portion 31 is disposed between neighboring shading portions 31, and an orthographic projection of the color film portion 32 on the substrate 11 overlaps with an orthographic projection of the light-emitting device 51 on the substrate 11 and an orthographic projection of the second refracting portion 22 on the substrate 11.

Here, the type of the shading portion is not specifically limited. Exemplarily, the shading portion may include a black matrix (BM).

Here, the material of the shading portion is not specifically limited. Exemplarily, the material of the shading portion may include black resin.

Here, the shape of the orthographic projection of the shading portion on the substrate is not specifically limited. Exemplarily, the shape of the shading portion may include a positive trapezoid, an inverted trapezoid, a rectangle, etc.

That the orthographic projection of the shading portion on the substrate overlaps with the orthographic projection of the barrier on the substrate refers to: the orthographic projection of the shading portion on the substrate overlaps with the orthographic projection of the barrier on the substrate partially; or the orthographic projection of the shading portion on the substrate completely overlaps with the orthographic projection of the barrier on the substrate. FIG. 1, FIG. 2, FIG. 3 and FIG. 4 are illustrated with the orthographic projection of the shading portion 31 on the substrate 11 being located within the orthographic projection of the barrier 52 on the substrate 11.

That the orthographic projection of the shading portion on the substrate overlaps with the orthographic projection of the first refracting portion on the substrate refers to: the orthographic projection of the shading portion on the substrate overlaps with the orthographic projection of the first refracting portion on the substrate partially; or the orthographic projection of the shading portion on the substrate completely overlaps with the orthographic projection of the first refracting portion on the substrate. FIG. 1, FIG. 2, FIG. 3 and FIG. 4 are illustrated with the orthographic projection of the shading portion 31 on the substrate 11 overlapping with the orthographic projection of the first refracting portion 21 on the substrate 11 partially.

The color film portion (CF) stated above is used for realizing color display. There is no specific restriction on the color of the color film portion stated above. Exemplarily, the colors of the plurality of color film portions may be the same; or the colors of the plurality of color film portions may be different; or, the colors of the plurality of color film portions may be partially same. FIG. 1, FIG. 2, FIG. 3 and FIG. 4 are illustrated with the color converting layer 3 including three color film portions 32, and the colors of the three color film portions 32 being different. Specifically, referring to FIG. 1, FIG. 2, FIG. 3 and FIG. 4, three color film portions 32 are the blue color film portion 321 corresponding to the blue light-emitting device 511, the red color film portion 322 corresponding to the red light-emitting device 511, and the green color film portion 321 corresponding to the green light-emitting device 511, respectively.

Here, the shape of the orthographic projection of the color film portion on the substrate is not specifically limited. Exemplarily, the shape of the shading portion may include a positive trapezoid, an inverted trapezoid, a rectangle, etc.

That the orthographic projection of the color film portion on the substrate overlaps with the orthographic projection of the light-emitting device on the substrate refers to: the orthographic projection of the color film portion on the substrate overlaps with the orthographic projection of the light-emitting device on the substrate partially; or the orthographic projection of the color film portion on the substrate completely overlaps with the orthographic projection of the light-emitting device on the substrate. FIG. 1, FIG. 2, FIG. 3 and FIG. 4 are illustrated with the orthographic projection of the light-emitting device 51 on the substrate 11 being located within the orthographic projection of the color film portion 32 on the substrate 11.

That the orthographic projection of the color film portion on the substrate overlaps with the orthographic projection of the second refracting portion on the substrate refers to: the orthographic projection of the color film portion on the substrate overlaps with the orthographic projection of the second refracting portion on the substrate partially; or the orthographic projection of the color film portion on the substrate completely overlaps with the orthographic projection of the second refracting portion on the substrate. FIG. 1, FIG. 2, FIG. 3 and FIG. 4 are illustrated with the orthographic projection of the color film portion 32 on the substrate 11 overlapping with the orthographic projection of the second refracting portion 22 on the substrate 11 partially.

In the related art, because the anode and the cathode in the OLED display panel have high reflectivity, the anode and the cathode have strong reflection to the external light, resulting in a decrease in the contrast of the OLED display panel. At this time, an additional polarizer is required to be arranged to prevent external light reflection (ambient light reflection). However, the low transmittance (<50%) of the polarizer greatly increases the power consumption of the OLED display panel to achieve the same brightness. Due to the characteristics of the material and the structure of the polarizer, the arranging of the polarizer may also affect the flexibility of the OLED display panel.

In the display panel according to the embodiments of the present application, by arranging the color film portion at the light-existing side of the display panel, it may not only replace the polarizer to prevent external light reflection, but also has the advantages of reducing power consumption, having a good flexibility, thinning the back plate and preventing color mixing due to high light transmittance.

Figure 8:
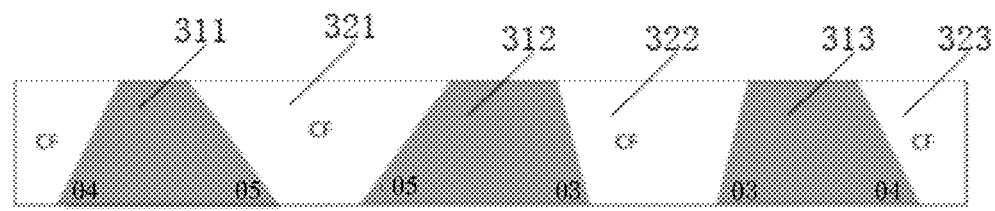
FIG. 8 is a schematic structural diagram of a shading portion and a color film portion in one light-emitting unit according to an embodiment of the present application.

Optionally, as shown in FIG. 8, for contacting surfaces of the shading portion 31 and the color film portion 32 corresponding to one light-emitting unit, and for the displaying surface of the display panel, a plurality of second inclining angles are formed by the contacting surface and the displaying surface, at least one of the second inclining angles is larger than the other second inclining angles. By controlling the second inclining angles between the contacting surface of the shading portion and the color film portion and the displaying surface of the display panel, that is, the smaller the inclination of the contacting surface of the shading portion and the color film portion, the faster the L-decay decreases under the large viewing angle of the corresponding color. For example, if the picture appears color deviation towards red under a large viewing angle, as shown in FIG. 8, the angle θ3 corresponding to the red (R) light-emitting device of the contacting surface of the shading portion 31 and the color film portion 32 is larger, which may effectively improve the condition of color deviation towards red.

The color converting layer shown in FIG. 8 may be applied to the display panel in FIG. 1, FIG. 2, FIG. 3 and FIG. 4, so that the color film portion 321 in the color converting layer shown in FIG. 8 corresponds to the blue light-emitting device in FIGS. 1-4, the color film portion 322 corresponds to the red light-emitting device in FIGS. 1-4, and the color film portion 323 corresponds to the green light-emitting device in FIGS. 1-4, at this time, by setting θ3>θ4>θ5, the condition of color deviation towards red can be effectively improved.

Here, the relationship between the other second inclining angles stated above is not specifically limited. Exemplarily, the above other second inclining angles may be the same. Or, the other second inclining angles stated above may be different; alternatively, the other second inclining angles may be partially the same.

It should be noted that as shown in FIG. 8, the shading portion 31 is a positive trapezoid, and the color film portion 32 is an inverted trapezoid. There are two second inclining angles between the contacting surface of the shading portion 31 and the color film portion 32 corresponding to the red (R) light-emitting device and the displaying surface of the display panel. The second inclining angles may be the inner angle or outer angle of the shading portion 31, here, the second inclining angle refers to the inner angle of the shading portion 31.

Optionally, in order to further reduce the redness and cyan of the display panel under a large viewing angle, the light-emitting unit includes a red light-emitting device, a green light-emitting device and a blue light-emitting device, for a contacting surface of the shading portion and the color firm portion corresponding to the red light-emitting unit, and for a displaying surface of the display panel, the second inclining angle between the contacting surface and the displaying surface is the largest. By controlling the second inclining angle, the color deviation towards red under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may be not completely the same.

Here, the relative relationship between the second inclining angle between the contacting surface of the shading portion and the color film portion corresponding to the green light-emitting device and the displaying surface of the display panel and the second inclining angle between the contacting surface of the shading portion and the color film portion corresponding to the blue light-emitting device is not limited. Exemplarily, it may be that the second inclining angle between the contacting surface of the shading portion and the color film portion corresponding to the green light-emitting device and the displaying surface of the display panel is the same to the second inclining angle between the contacting surface of the shading portion and the color film portion corresponding to the blue light-emitting device. Or, it may also be that the second inclining angle between the contacting surface of the shading portion and the color film portion corresponding to the green light-emitting device and the displaying surface of the display panel is larger than the second inclining angle between the contacting surface of the shading portion and the color film portion corresponding to the blue light-emitting device. Or, it may also be that the second inclining angle between the contacting surface of the shading portion and the color film portion corresponding to the blue light-emitting device is larger than the second inclining angle between the contacting surface of the shading portion and the color film portion corresponding to the green light-emitting device and the displaying surface of the display panel. At this time, the red side luminescence<the green side luminescence<the blue side luminescence.

Optionally, in order to further reduce the problem that the display panel appear color deviation towards blue under a large viewing angle, the light-emitting unit includes a red light-emitting device, a green light-emitting device and a blue light-emitting device, for a contacting surface of the shading portion and the color firm portion corresponding to the blue light-emitting unit, and for a displaying surface of the display panel, and the second inclining angle between the contacting surface and the displaying surface is the largest. By controlling the second inclining angle, the color deviation towards blue under a large viewing angle may be further controlled, so that the display panel presents a better display effect.

Here, the area sizes of the red light-emitting device, the green light-emitting device and the blue light-emitting device are not limited. Exemplarily, the areas of the red light-emitting device, the green light-emitting device and the blue light-emitting device may be the same; or, the areas of the red light-emitting device, the green light-emitting device and the blue light-emitting device may be not completely the same.

Here, the relative relationship between the second inclining angle between the contacting surface of the shading portion and the color film portion corresponding to the green light-emitting device and the displaying surface of the display panel and the second inclining angle between the contacting surface of the shading portion and the color film portion corresponding to the red light-emitting device is not limited. Exemplarily, it may be that the second inclining angle between the contacting surface of the shading portion and the color film portion corresponding to the green light-emitting device and the displaying surface of the display panel is the same to the second inclining angle between the contacting surface of the shading portion and the color film portion corresponding to the red light-emitting device. Or, it may also be that the second inclining angle between the contacting surface of the shading portion and the color film portion corresponding to the green light-emitting device and the displaying surface of the display panel is larger than the second inclining angle between the contacting surface of the shading portion and the color film portion corresponding to the red light-emitting device. Or, it may also be that the second inclining angle between the contacting surface of the shading portion and the color film portion corresponding to the red light-emitting device is larger than the second inclining angle between the contacting surface of the shading portion and the color film portion corresponding to the green light-emitting device and the displaying surface of the display panel.

Figure 9:
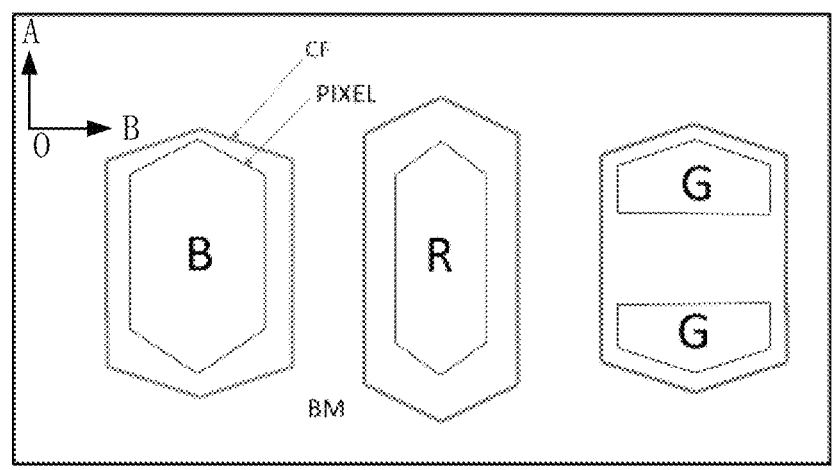
FIG. 9 is a structural top view of a third type of the light-emitting device and the color film portion in one light-emitting unit according to an embodiment of the present application.

Optionally, referring to FIG. 9, the plurality of shading portions (marked with BM in the figures) are disposed around one color film portion, and the second inclining angle between the contacting surface that the shading portion and the color film portion contact with each other in a first direction (marked with OB in the figures) and the displaying surface of the display panel is larger than the second inclining angle between the contacting surface that the shading portion and the color film portion contact with each other in a second direction (marked with OA in the figures) and the displaying surface of the display panel; and the first direction and the second direction are perpendicular.

As seen in FIG. 9, which is illustrated with taking the red (R) light-emitting device as an example. Due to the shape of the color film portion (marked with CF in the figures) corresponding to the red (R) light-emitting device, the distance between the shading portion BM and the color film portion in the OB direction is less than the distance between the shading portion BM and the color film portion in the OA direction in the shading portion BM around the color film portion. Therefore, the second inclining angle between the contacting surface that the shading portion and the color film portion contact with each other in the OB direction and the displaying surface of the display panel is set larger than the second inclining angle between the contacting surface of the shading portion and the color film portion in the OA direction and the displaying surface of the display panel, which not only ensures that the light of a color emitted by the color film portion is reduced in the OB direction and reduces color deviation of the color under large viewing angles in the OB direction, at a same time, but also may control the reflection color of the reflected light of the display panel to be white with being the black screen in the off-screen or shut down state.

It should be noted that the second inclining angle between the contacting surface of the shading portion and the color film portion in the second direction (the OA direction shown in the figures) and the displaying surface of the display panel is set larger than the second inclining angle between the contacting surface of the shading portion and the color film portion in the first direction (the OB direction shown in the figures) and the displaying surface of the display panel, which not only ensures that the light of a color emitted by the color film portion is reduced in the OA direction and reduces color deviation of the color under large viewing angles in the OA direction, at a same time, but also may control the specific color sense of the black screen with being the black screen in the off-screen or shutdown state, so that the reflection color of the reflected light in the black screen is white and that the color sense of the whole reflected light of the external light in the black screen to be a is specific color (such as red, green or blue) rather than white is avoided.

Optionally, referring to FIG. 5 and FIG. 6, in one light-emitting unit, areas of all the color film portions overlapping with an orthographic projection of the light-emitting device on the substrate are the same as areas of un-overlapping part of the shading portion overlapping with the orthographic projection of the barrier on the substrate.

In related art, due to the characteristics of the EL material, the opening size of R/G/B light/emitting device often produced is inconsistent, as shown in FIG. 5, the light-emitting unit is arranged by using GGRB. Usually the opening of the blue (B) light-emitting device is larger than the opening of the red (R) light-emitting device and larger than the opening of the green (G) light-emitting device. Then the color film portion (CF) areas corresponding to the light-emitting devices of colors are also inconsistent. Therefore, when the display panel displays a black screen, the color of the reflected light (even if the anode is very flat and there is no color separation) on the display screen of the display panel is affected by the area where the color film portion (CF) does not overlap with the shading portion (BM). For example, the area of the color film portion (CF) of the blue (B) light-emitting device is the largest, so the light reflected by the external light when the display panel displays the black screen may be towards green after passing through the color film portion (CF), and the color sense presented is green. In order to solve the above problems, according to the embodiments of the present application, by arranging that areas of all of the color film portions overlapping with an orthographic projection of the light-emitting device on the substrate are the same as areas of un-overlapping parts of the shading portion overlapping with the orthographic projection of the barrier on the substrate, that is, the areas of the color film portions (CF) of colors is designed to be the same, so that after the light reflected by the external light passing through the color film portion (CF) when the display panel shows the black picture, and the light output of colors remains the same. there will be no conditions that the reflection deviates any one of colors with simply reflecting white.

It should be noted that there is no specific limit on the shapes and the areas of the light-emitting devices of colors. Exemplarily, the shapes and the areas of the light-emitting devices of colors may be the same; or, the shapes and areas of the light-emitting devices of colors may be different; or, the shapes and the areas of the light-emitting devices of colors may be partially the same. Taking the light-emitting device arrangement of GGRB in FIG. 5, FIG. 9 and FIG. 11 as an example, the CF areas corresponding to the pixels of R/G/B three colors also remain unchanged, but the shapes and the areas are not exactly the same. FIG. 6 are illustrated by taking that the shapes and the areas of the blue light-emitting device, the red light-emitting device and the green light-emitting device are the same as an example.

Figure 10:
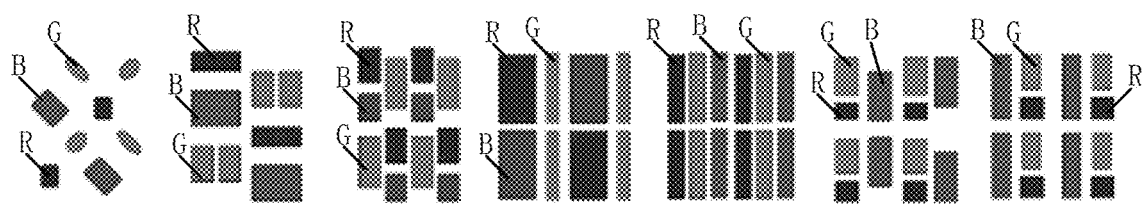
FIG. 10 is an arrangement diagram of a plurality of the light-emitting devices according to an embodiment of the present application.

Moreover, there is no specific limit on the arrangement of the light-emitting devices of the colors, and there are a variety of light-emitting device arrangements in FIG. 10. That is, no matter how the light-emitting devices of the colors is arranged, whether the sizes and the numbers of the light-emitting devices of the colors are consistent, the light-emitting device opening areas of the colors corresponding to the color film portion (CF) are consistent.

Figure 11:
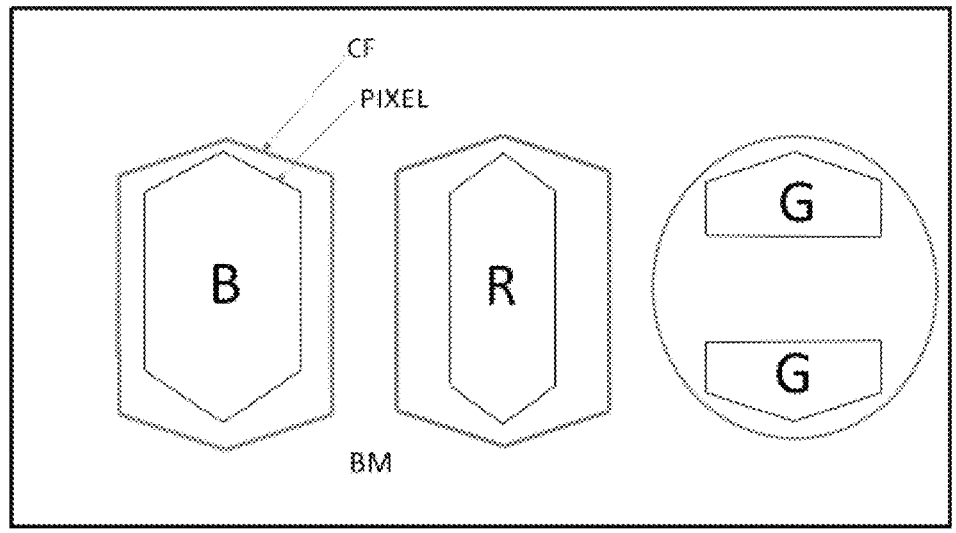
FIG. 11 is a structural top view of a fourth type of the light-emitting device and the color film portion in one light-emitting unit according to an embodiment of the present application.
Figure 12:
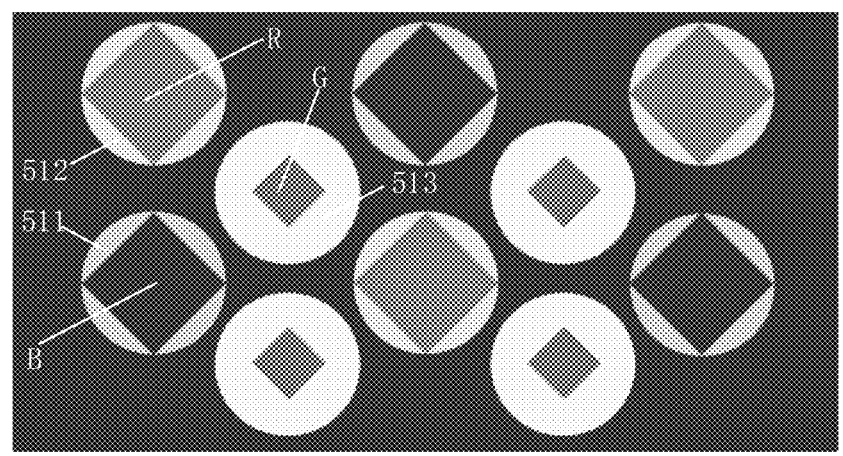
FIG. 12 is a structural top view of a fifth type of the light-emitting device and the color film portion in one light-emitting unit according to an embodiment of the present application.

Optionally, for ease of production, referring to FIG. 11 and FIG. 12, shapes of orthographic projections of all of parts of the color film portions (marked with CF in the figures) which do not overlap with the shading portion (marked with BM in the figures) on the substrate are the same, and the shapes include any one of a polygon, an arc, a circle and an ellipse.

Taking the light-emitting device arrangement of GGRB in FIG. 5, FIG. 9 and FIG. 11 as an example, the shape of the light-emitting device may be adjusted according to the actual needs. For example, because the human eye is most sensitive to green, when using the color film portion, the color separation phenomenon is caused due to the anode is not flat, and when the shape of the light-emitting device is either circle or ellipse, the color separation is the slightest in human eyes. However, if changing the light-emitting devices is only for color film portion, the development of light-emitting device arrangement is required, which not only increases the cost but also takes time. In order to solve this problem, in the embodiments of the present disclosure, it is designed that the shapes of the orthographic projections of the parts of the color film portions corresponding to the light-emitting device of a certain color or some colors which do not overlap with the shading portion on the substrate are circle or ellipse, which can improve the color separation of the color that the human eye can sense to a certain extent.

Of course, if the shapes of the orthographic projections of the parts of the color film portions corresponding to the light-emitting devices of the colors which do not overlap with the shading portion on the substrate are designed to be circle or ellipse, as shown in FIG. 12, all shapes are designed to be circle, and the color separation that the human eye can sense may be improved to the greatest extent.

It should be noted that all shapes of orthographic projections of the parts of the color film portions which do not overlap with the shading portion on the substrate may be different, and include any one of a polygon, an arc, a circle and an ellipse; or all shapes of orthographic projections of all of parts of the color film portions which do not overlap with the shading portion on the substrate may be partially the same, and include any one of a polygon, an arc, a circle and an ellipse.

Optionally, referring to FIG. 1, FIG. 2, FIG. 3, and FIG. 4, the dimming layer 2 further includes a first dimming sublayer 23 disposed on one side of the first refracting portion 21 away from the display panel, and the first dimming sublayer 23 covers the first refracting portion 21 and the second refracting portion 22.

For ease of production, referring to FIG. 1, FIG. 2 and FIG. 3, a refractive index of the material of the first dimming sublayer 23 is the same as the refractive index of the material of the first refracting portion 21.

Figure 4:
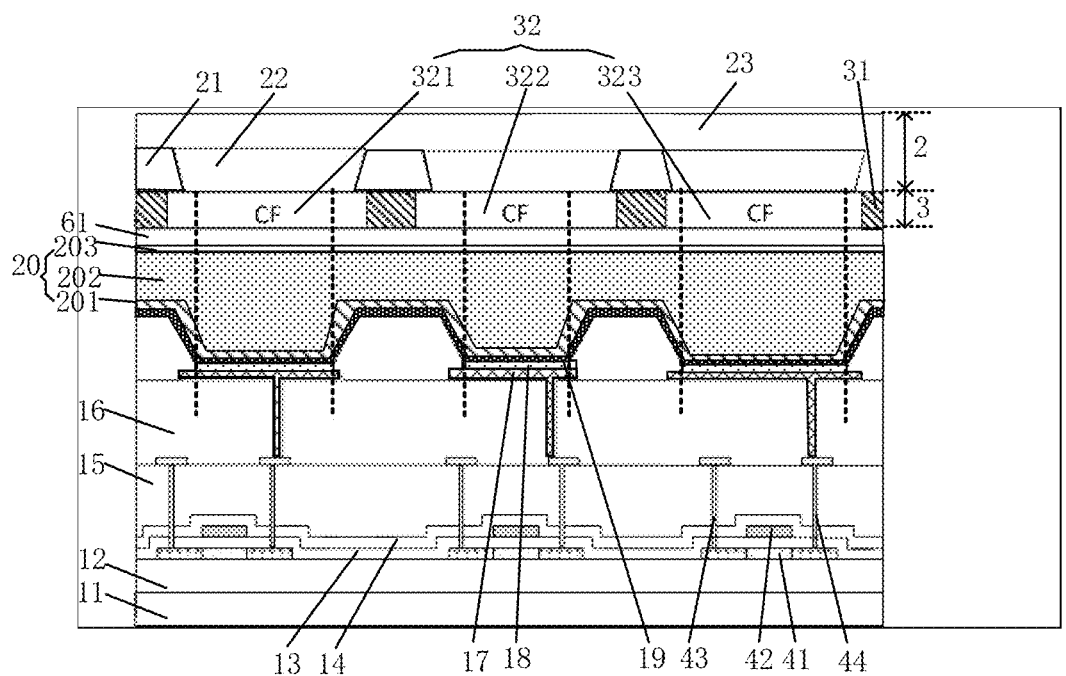
FIG. 4 is a schematic structural diagram of a display panel according to yet another embodiment of the present application.

Or, for ease of production, referring to FIG. 4, the refractive index of the material of the first dimming sublayer 23 is the same as the refractive index of the material of the second refracting portion 22.

In addition, in some embodiments of the present application, as shown in FIG. 1, FIG. 2, FIG. 3, and FIG. 4, the display panel may also include an encapsulation layer 20 disposed between the display panel and the color converting layer 3, and the encapsulation layer 20 covers the luminescent layer. The structure of the encapsulation layer is not specifically limited here. Exemplarily, the encapsulation layer may be only one layer, such as the inorganic layer; alternatively, the encapsulation layer 20 may include a first inorganic encapsulation layer 201, an organic encapsulation layer 202 and a second inorganic encapsulation layer 203 as shown in FIG. 1, FIG. 2, FIG. 3 and FIG. 4, which is determined according to the actual applications.

Moreover, the display panel may also include a touch layer between the display panel and the color converting layer, and the touch layer is disposed on the surface of the color converting layer close to the luminescent layer, that is, the touch layer and the color converting layer may be used as a whole to simplify the structure and process. The touch layer may adopt a self-contained touch structure or a mutual-contained touch structure. There is no special limitation on its specific structure, as long as the touch function can be realized. Of course, the touch layer may also be disposed on the side of the color converting layer away from the driving back plate, and there is no special limitation on its specific location and process. Exemplarily, the touch layer may be a flexible multi-layer on cell (FMLOC) touch layer.

In addition, referring to FIG. 1, FIG. 2, FIG. 3 and FIG. 4, the display panel may also include the second buffer layer 61 disposed between the encapsulation layer 20 and the color converting layer 3, so that the color converting layer 3 is easier to produce.

On the other hand, the embodiments of the present application further provide a display apparatus, including the display panel stated above.

The display apparatus may be a display apparatus with touch function, or a display apparatus with folding or curling function, or a display apparatus with both touch function and folding function, which is not limited here. The display apparatus may be a flexible display apparatus (which is also known as a flexible screen) or a rigid display apparatus (that is, a display screen that cannot be bent), which is not limited here.

The display apparatus stated above may be an OLED display apparatus, a Micro LED display apparatus or a Mini LED display apparatus, or may also be an LCD display apparatus.

The display apparatus may be a television, a digital camera, a mobile phone, a tablet and other products or components with display function. The display apparatus stated above may also be used in the fields of identity recognition, medical equipment and so on. Products that have been promoted or have good prospects for promotion include security identity authentication, smart door locks, medical image acquisition and so on. The display apparatus has the advantages of weak color deviation under large viewing angles, white display with being the black screen in the off-screen or shutdown state, high die-cutting yield, low cost, good display effect, long life, high stability, high contrast, good imaging quality and high product quality.

In the specification provided herein, numerous specific details are set forth. It will be understood, however, that the embodiments of the present disclosure may be practiced without these specific details. In some instances, well-known methods, structures, and techniques have not been shown in detail in order not to obscure an understanding of this specification.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: they can still modify the technical solutions recorded in the foregoing embodiments, or they can equivalently replace some technical features thereof; and these modifications or replacements do not make the essence of the corresponding technical solutions deviate from the spirit and scope of the technical solutions of the embodiments of the present disclosure.

The invention claimed is:

1. A display panel, comprising:
a substrate and a plurality of light-emitting units disposed on the substrate, wherein the light-emitting units comprises a plurality of light-emitting devices arranged in an array, and a barrier is disposed between neighboring light-emitting devices;
a dimming layer disposed on a light-exiting side of the light-emitting unit, wherein the dimming layer comprises a plurality of first refracting portions arranged in an array, and a second refracting portion is disposed between neighboring first refracting portions and contacted with the first refracting portions; and
orthographic projections of the first refracting portions on the substrate overlap with an orthographic projection of the barrier on the substrate, and an orthographic projection of the second refracting portion on the substrate overlaps with orthographic projections of the light-emitting devices on the substrate, wherein:
a refractive index of a material of the first refracting portion is less than a refractive index of a material of the second refracting portion;
for a contacting surface of the first refracting portion and the second refracting portion, and for a displaying surface of the display panel, an angle between the contacting surface and the displaying surface is an acute angle or an obtuse angle; and
in the first refracting portions corresponding to one light-emitting unit, a height of at least one first refracting portion in a direction perpendicular to the substrate is larger than heights of the other first refracting portions in the direction perpendicular to the substrate.

2. The display panel according to claim 1, wherein for the light-emitting devices in one light-emitting unit, a diffusion distance of at least one light-emitting device is less than diffusion distances of the other light-emitting devices; wherein the diffusion distance refers to a distance between a boundary of the orthographic projection of the light-emitting device on the substrate and a boundary of the orthographic projection of the first refracting portion on the substrate.

3. The display panel according to claim 2, wherein the light-emitting unit comprises a red light-emitting device, a green light-emitting device and a blue light-emitting device; and a diffusion distance of the red light-emitting device is less than a diffusion distance of the green light-emitting device, and a diffusion distance of the red light-emitting device is less than the diffusion distance of the blue light-emitting device.

4. The display panel according to claim 2, wherein the light-emitting unit comprises a red light-emitting device, a green light-emitting device and a blue light-emitting device and a diffusion distance of the blue light-emitting device is less than a diffusion distance of the green light-emitting device, and a diffusion distance of the blue light-emitting device is less than a diffusion distance of the red light-emitting device.

5. The display panel according to claim 1, wherein for contacting surfaces of the first refracting portions and the second refracting portions corresponding to one light-emitting unit, and for the displaying surface of the display panel, a plurality of first inclining angles are formed by the contacting surfaces and the displaying surface, wherein at least one of the first inclining angles is larger than the other first inclining angles.

6. The display panel according to claim 5, wherein the light-emitting unit comprises a red light-emitting device, a green light-emitting device and a blue light-emitting device, for a contacting surface of the first refracting portion and the second refracting portion corresponding to the red light-emitting device, and for a displaying surface of the display panel, the first inclining angle between the contacting surface and the displaying surface is the largest.

7. The display panel according to claim 5, wherein the light-emitting unit comprises a red light-emitting device, a green light-emitting device and a blue light-emitting device, for a contacting surface of the first refracting portion and the second refracting portion corresponding to the blue light-emitting device, and for a displaying surface of the display panel, the first inclining angle between the contacting surface and the displaying surface is the largest.

8. The display panel according to claim 1, wherein the light-emitting unit comprises a red light-emitting device, a green light-emitting device and a blue light-emitting device, and the first refracting portion which overlaps with the orthographic projection of the barrier adjacent to the red light-emitting device on the substrate has a maximum height in the direction perpendicular to the substrate.

9. The display panel according to claim 1, wherein the light-emitting unit comprises a red light-emitting device, a green light-emitting device and a blue light-emitting device, and the first refracting portion which overlaps with the orthographic projection of the barrier adjacent to the blue light-emitting device on the substrate has a maximum height in the direction perpendicular to the substrate.

10. The display panel according to claim 1, wherein the display panel further comprises a color converting layer, and the color converting layer is disposed between the display panel and the dimming layer, or the color converting layer is disposed on one side of the dimming layer away from the display panel.

11. The display panel according to claim 10, wherein the color converting layer comprises a plurality of shading portions arranged in an array, and orthographic projections of the shading portions on the substrate overlap with the orthographic projection of the barrier on the substrate and the orthographic projection of the first refracting portion on the substrate; and
a color film portion contacting with the shading portion is disposed between neighboring shading portions, and an orthographic projection of the color film portion on the substrate overlaps with the orthographic projection of the light-emitting device on the substrate and the orthographic projection of the second refracting portion on the substrate.

12. The display panel according to claim 11, wherein for contacting surfaces of the shading portion and the color film portion corresponding to one light-emitting unit, and for the displaying surface of the display panel, a plurality of second inclining angles are formed by the contacting surface and the displaying surface, wherein at least one of the second inclining angles is larger than the other second inclining angles.

13. The display panel according to claim 12, wherein the light-emitting unit comprises a red light-emitting device, a green light-emitting device and a blue light-emitting device, for a contacting surface of the shading portion and the color firm portion corresponding to the red light-emitting unit, and for a displaying surface of the display panel, the second inclining angle between the contacting surface the displaying surface is the largest.

14. The display panel according to claim 12, wherein the light-emitting unit comprises a red light-emitting device, a green light-emitting device and a blue light-emitting device, for a contacting surface of the shading portion and the color firm portion corresponding to the blue light-emitting unit, and for a displaying surface of the display panel, the second inclining angle between the contacting surface and the displaying surface is the largest.

15. The display panel according to claim 12, wherein the plurality of shading portions are disposed around one color film portion, and the second inclining angle between the contacting surface that the shading portion and the color film portion contact with each other in a first direction and the displaying surface of the display panel is larger than the second inclining angle between the contacting surface that the shading portion and the color film portion contact with each other in a second direction and the displaying surface of the display panel; and the first direction and the second direction are perpendicular.

16. The display panel according to claim 10, wherein in one light-emitting unit, areas of all the color film portions overlapping with the orthographic projection of the light-emitting device on the substrate are the same as areas of un-overlapping parts of the shading portion overlapping with the orthographic projection of the barrier on the substrate.

17. The display panel according to claim 1, wherein the dimming layer further comprises a first dimming sublayer disposed on one side of the first refracting portion away from the display panel, and the first dimming sublayer covers the first refracting portion and the second refracting portion; and a refractive index of the material of the first dimming sublayer is the same as the refractive index of the material of the first refracting portion; or the refractive index of the material of the first dimming sublayer is the same as the refractive index of the material of the second refracting portion.

18. A display apparatus, comprising the display panel according to claim 1.

* * * * *